United States Patent [19]

Yamauchi et al.

[11] 4,035,786

[45] July 12, 1977

[54] OPERATION STATE MONITORING APPARATUS

[75] Inventors: Nobuharu Yamauchi; Masaji Matsumura; Katsuhide Morimoto, all of Amagasaki, Japan

[73] Assignee: Mitsubishi Denki Kabushiki Kaisha, Tokyo, Japan

[21] Appl. No.: 562,869

[22] Filed: Mar. 27, 1975

[30] Foreign Application Priority Data

Mar. 28, 1974 Japan .............................. 49-34500

[51] Int. Cl.² .................... G01D 7/12; G06K 15/20
[52] U.S. Cl. .................... 340/213 Q; 340/324 AD
[58] Field of Search ........ 340/324 A, 324 AD, 206, 340/213 Q

[56] References Cited

U.S. PATENT DOCUMENTS

| | | |
|---|---|---|
| 3,234,543 | 2/1966 | Thompson et al. ............. 340/216 X |
| 3,324,458 | 6/1967 | MacArthur ..................... 340/324 A |
| 3,406,387 | 10/1968 | Werme ....................... 340/324 AD |
| 3,469,252 | 9/1969 | Bet ................. 340/324 A |
| 3,662,373 | 5/1972 | Schumann ..................... 340/324 A |
| 3,745,407 | 7/1973 | Day .............................. 340/324 A |
| 3,750,134 | 7/1973 | Weisend ........................ 340/324 A |
| 3,818,474 | 6/1974 | Kurner et al. .............. 340/324 AD |

Primary Examiner—David L. Trafton
Attorney, Agent, or Firm—Oblon, Fisher, Spivak, McClelland & Maier

[57] ABSTRACT

An operation state monitoring apparatus for monitoring an operation state of a controlled object is disclosed. The apparatus compares actual operation state data of the controlled object with reference operation state data of the controlled object read out from a reference operation state data memory and sets desirable data selected from the actual operation state data to the reference operation state data memory as the reference operation state data.

5 Claims, 6 Drawing Figures

FIG. 1
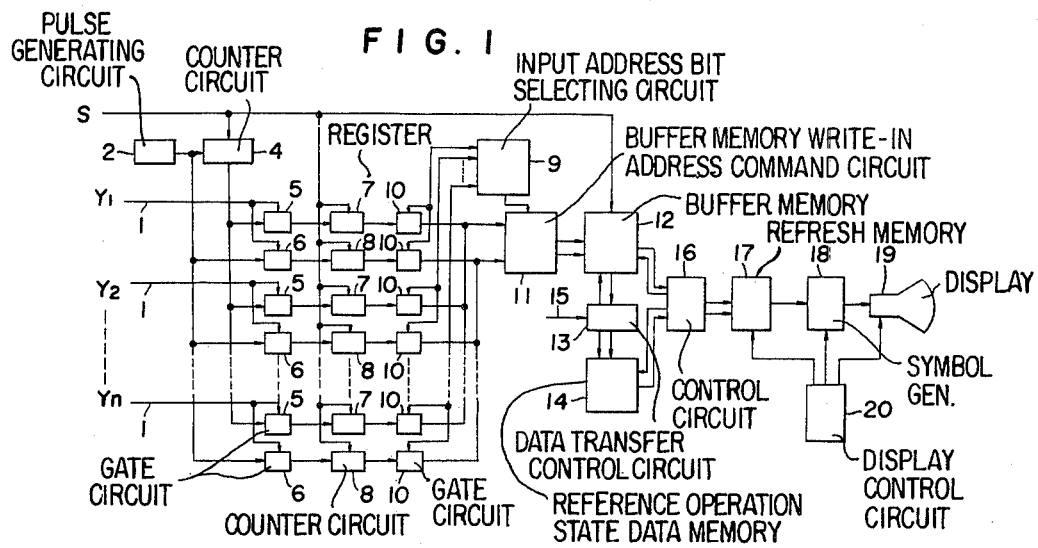
FIG. 2
```
         0 1 2 3 4 5 6 7 8 9 10 11 12 13 14 15 ---- 99TH. ADDRESS
100TH. ADDRESS  Y1  1 1 1 1 1 1 1 1 0 0 0 0 ------------ 0
200TH.    "     Y2  0 0 0 0 0 0 0 0 1 1 1 1 0 0 0 ------ 0
300TH.    "     Y3  0 0 0 0 0 0 0 0 1 1 1 1 1 1 0 ----- 0
```
FIG. 3
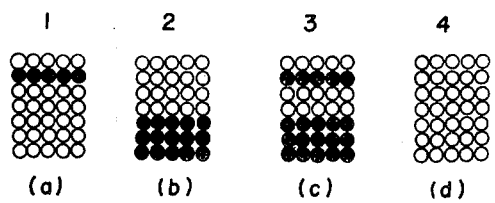
(a)　(b)　(c)　(d)
FIG. 4
Y1 
Y2 
Y3 

OPERATION STATE MONITORING APPARATUS

BACKGROUND OF THE INVENTION

1. Field of the Invention

The present invention relates to an operation state monitoring apparatus which comprises actual operation state data of a controlled object and a predetermined reference operation state data and monitors the operation state of the controlled object from the difference of the data.

2. Description of the Prior Art

Heretofore, in operation state monitoring apparatus, the set of the reference operation state data to the reference operation state data memory recording the reference operation state data of the controlled object is provided for each operation state by a digital switch or another setting device. However, excessive time is required for the set and it is difficult to provide suitable reference data for the operation. In a mass production line which requires the shortening of the operation period of one operation step even for one minute or one second to increase operation efficiency, it is usual to change the control many times to shorten the cycle time so that it is necessary to change the operation state in steps such as the ON state and the OFF state, the time interval and the ON-OFF repeat time interval of the controlled object such as a limit switch, a solenoid valve, etc.

Thus, there are many controlled objects and, accordingly, it has been necessary to change the sets of the digital switch or the other setting device for each change of the control considering the reference state data for each operation state. These operations have been difficult to perform in actual operation.

SUMMARY OF THE INVENTION

It is an object of the present invention to provide an operation state monitoring apparatus which overcomes the above-mentioned disadvantages and which can set the reference operation state data to the reference operation state data memory without a digital switch or other setting device and can follow many changes of the control manner.

It is another object of the invention to provide an operation state monitoring apparatus which records new operation state data caused by changes of the control manner of the controlled object in a memory and transfers the recorded data as new reference operation state data to a reference operation state data memory thereby confirming the applicability of the transferred data before the transfer of the data to the reference operation state data memory so that data having high reliability can be speedily and conveniently recorded in comparison with conventional operation state monitoring apparatus.

The foregoing and other objects are attained in accordance with one aspect of the present invention, through the provision of an operation state monitoring apparatus for monitoring an operation state of a controlled object comprising means for comparing actual operation state data of said controlled object with reference operation state data of said controlled object read out from a reference operation state data memory, and means for setting desirable data selected from the actual operation state data to said reference operation state data memory as the reference operation state data.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which:

FIG. 1 is a block diagram of one embodiment of the apparatus according to the invention;

FIG. 2 is a schematic diagram of memorized data of the input signal state;

FIG. 3 is a diagram of dot matrices read out from a symbol generator;

FIG. 4 is a diagram of one time chart displayed on a display; and

DETAILED DESCRIPTION OF THE PREFERRED EMBODIMENTS

Figure 5:
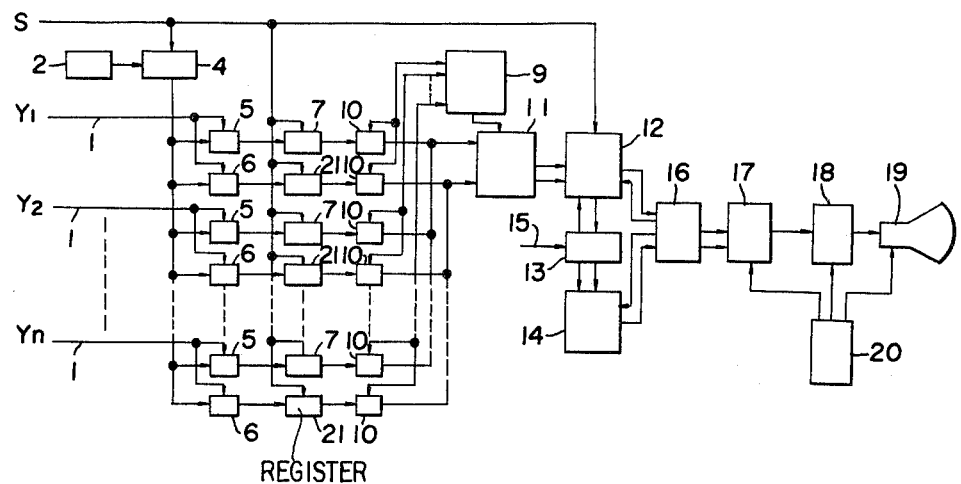
FIGS. 5 and 6 are respectively block diagrams of other embodiments of the apparatus according to the invention.

Referring now to the drawings, wherein like reference numerals designate identical or corresponding parts throughout the several views, and more particularly to FIG. 1 thereof, one embodiment of the invention will be described.

In FIG. 1, the reference number 1 designates an input signal for showing the operation state of the controlled object such as a limit switch, a solenoid valve, etc.; wherein n is an integer number of the input signals $Y_1$, $Y_2 \ldots Y_n$; 2 designates a pulse generating circuit for generating pulse trains having a constant period; S designates a start signal which is applied at the start of one operation step of the controlled object; 4 and 8 designate counter circuits; 5, 6 and 10 designate gate circuits; 7 designates a register; 9 designates an input bit address selecting circuit; 11 designates a buffer memory write-in address command circuit; 12 designates a buffer memory; 13 designates a data transfer control circuit; 14 designates a reference operation state data memory; 15 designates a data transfer command signal; 16 designates a control circuit wherein the data in the memory address corresponding to the buffer memory 12 and the reference operation state data memory 14 are combined to record display symbol codes in a refresh memory 17. The reference numeral 18 designates a symbol generator; 19 designates a display; and 20 designates a display control circuit.

For ease of understanding the present invention, the case will be described wherein the ON state of each input signal during one operation step of the controlled object is one and the ON state of the input signal is monitored as the operation state.

When the start signal S is generated from the controlled object, the counter circuits 4, 8 and the register 7 are reset and the data in the buffer memory 12 are cleared. Then, the counter circuit 4 sequentially counts the pulse trains from the pulse generating circuit 2.

When the input signal $Y_1$ is switched from the OFF state to the ON state, the gate circuit 5 corresponding to $Y_1$ is turned off and the data of the counter circuit 4 are recorded in the register 7 corresponding to $Y_1$. In the gate circuit 5, the gate is turned off only when the input signal is switched from the OFF state to the ON state, whereby the data of the counter circuit 4 are recorded in the register 7. The recording in the register 7 does not occur during the period of the ON state or the OFF state of the input signal or when the input signal is switched from the ON state to the OFF state.

On the other hand, in the gate circuit 6, the gate is in the ON state during the period of the ON state of the input signal $Y_1$ and the pulse trains from the pulse generating circuit 2 are counted in the counter circuit 8. The gate circuits 5, 6 and the registers 7, and the counter circuits 8 corresponding to $Y_2, \ldots Y_n$ are operated in the same manner.

By the above-mentioned operation, the data of the register 7 shows the time switched to the ON state of the corresponding input signal 1 after the start signal S. The data of the counter circuit 8 shows the ON time interval (width) of the signal.

The input address bit selecting circuit 9 is a circuit for determining which data of the registers 7 and the counter circuits 8 is to be the operation state data of the input signal sent to the memory address of the buffer memory 12. Only the register 7 and the output gate 10 of the counter circuit 8 corresponding to the input signal controlled by the input address bit selecting circuit 9 are turned off to provide the input to the buffer memory write-in address command circuit 11.

In the buffer memory write-in address command circuit 11, the input signal turn-on data are recorded in the buffer memory 12 for the number of the counter circuit 8 from the memory in the memory address of the value given by a biasing constant which is predetermined for each input address bit selected by the input address selecting circuit 9 from the output of the register 7.

When the recording of the data for one input signal in the buffer memory 12 is completed, the input address bit selecting circuit 9 selects the next input bit address. When the recording of the data of the registers 7 and the counter circuit 8 for all input addresses to the buffer memory 12 is completed, the input address bit selecting circuit 9 selects the first input bit address and the same operation is repeated. In the same manner, the input signal turn-on time data are recorded in the corresponding memory addresses depending upon the operation state of the input signal in the buffer memory 12.

Assume for the purposes of illustration that the input signal $Y_1$ is allotted to the addresses 100–199; $Y_2$ is allotted to the addresses 200–299, ... and $Y_n$ is allotted to the addresses $(100 \times n) - (100 \times n + 99)$. Assume further that the data of the register 7 for $Y_1$ is zero; the data of the counter circuit 8 for $Y_1$ is 8; the data of the register 7 for $Y_2$ is 8; and the data of the counter circuit 8 for $Y_2$ is 4.

Firstly, the code for memory of signal $Y_1$ in the addresses 100 to 107 for 8 that is a code 1 is recorded; and the code for memory of signal $Y_2$ in the addresses $200 + 8 = 208$ to 211 is recorded because the allotted addresses for $Y_2$ are 200–299.

In the same manner, the codes for memory of signals corresponding to the data of the register 7 and the counter circuit 8 for input signals $Y_3, \ldots Y_n$ will be recorded in the buffer memory 12.

When the oscillation frequency of the pulse generator 2 is selected depending upon the memory region of the buffer memory 12 for the input signals, the maximum time interval for one operation step of the controlled object and the ON time interval for certain input signals, etc., there is no difficulty to record the operation state data for the input signal over the memory region or to adversely affect the operation state data for other input signals.

FIG. 2 is a schematic diagram of the memorized data of the input signals in the memory regions for the input signals of the buffer memory 12. In FIG. 2, 1 means the ON state of the input signal; 0 means the OFF state or the reset state of the input signal. On the other hand, the reference operation state data memory 14 has memory capacity similar to that of buffer memory 12.

The reference operation data are recorded in the memory as follows. When the controlled object finishes the normal control of one operation step, and the actual operation state data recorded in the buffer memory 12 at the time are used as the new reference operation data, the data transfer command signal 15 is generated by a key board or another operating device (not shown) if necessary. Thus, the data of the buffer memory 12 are transferred through the data transfer control circuit 13 to the corresponding memory addresses of the reference operation memory. For example, the data in the 100th address of the buffer memory 12 are transferred to the 100th address of the reference operation memory, the data in the 101st address of the buffer memory 12 are transferred to the 101st address of the reference operation memory, and the like, whereby the actual operation data are used as the reference operation data.

The data transfer command signal 15 can be automatically generated by a one operation step finish signal for accurately operating the controlled object or the desirable other signal. The data of the buffer memory 12 and the reference operation state data memory 14 in the corresponding memory address are combined in the control circuit 16. For example, the data read out from the buffer memory 12 are given to the bits in the upper position to the output data of the control circuit 16 and the data read out from the reference operation state data memory 14 are given to the bits in the lower position to the output data of the control circuit 16.

For example, the output data of the control circuit 16 is 3 in the case that the output of the buffer memory 12 is 1 and the output of the reference operation memory 14 is 1 when the bit numbers of the data read out from both memories are respectively 1 bit and the bit number of the output data of the control circuit 16 is 2 bits. The output of the control circuit 16 is 2 in the case that the output of the buffer memory 12 is 1 and the output of the reference operation memory 14 is zero. The output of the control circuit 16 is 1 when the output of the buffer memory 12 is zero and the output of the reference operation memory 14 is 1. The output of the control circuit 26 is zero when the outputs of both memories are zero.

The codes 3, 2, 1 and 0 are respectively recorded in the memory addresses of the refresh memory 17 corresponding to the memory addresses of the buffer memory 12 and the reference operation data memory 14 which is controlled and read out by the control circuit 16 depending upon each of the combinations. The refresh memory 17 has a memory capacity substantially equal to that of the symbol numbers capable of display on the display 19.

The refresh memory 17 can record and read out the data as desired. The display symbol codes recorded in the refresh memory are read out in a constant period and are fed to the symbol generator 18 which is a read-only-memory for converting the codes to dot matrices such as 5 × 7 dot matrices as shown in FIG. 3a in the case 1 of the display symbol code and as shown in FIG. 3b in the case of 2 of the display symbol code and as shown in FIG. 3c in the case of 3 of the display symbol code. In order to read out the dot matrix, all of the data are read out by seven 5 dot raster scans whereby the symbols are displayed on a display 19 such as a cathode-ray tube.

FIG. 4 is a time chart of the data displayed on the display 19 wherein the fine line shows the reference operation data and the thick line shows the actual operation data. The state of the actual operation of the controlled object to the reference operation can be clearly seen in FIG. 4. In the above-mentioned embodiment, the case that the input signal 1 is turned on only once during one operation step period is described. When the input signal repeats the ON-OFF states during one operation step period, or the input signal is in the OFF state, it is possible to give accurate operation data of the controlled object even in the case of repeating the ON-OFF state during one operation step period. This is done by resetting the register 7 and the counter circuit 8 and imparting a quite high scanning velocity compared to the ON-OFF repeat period of the input signal 1 for selecting a bit address of the input bit address selecting circuit 9.

FIG. 5 is a block diagram of another embodiment of the invention. In the embodiment of FIG. 5, a register 21 is used instead of the counter circuit 8 of the embodiment of FIG. 1 whereby the data of the counter circuit 4 are stored in the register 21 during the ON state of the input signal 1. The data of the register 21 memorizes, in equivalent, the final time of the ON state of the input signal 1 after applying the start signal S, for example, the time the input signal 1 is switched from the ON state to the OFF state.

In this case, the buffer memory write-in address command circuit 11 records the operation data of the controlled object in the buffer memory 12 from the memory address substantially depending upon the data of the register 7 selected by the input bit address selecting circuit 9 and the memory address substantially depending upon the data of the register 21.

Figure 6:
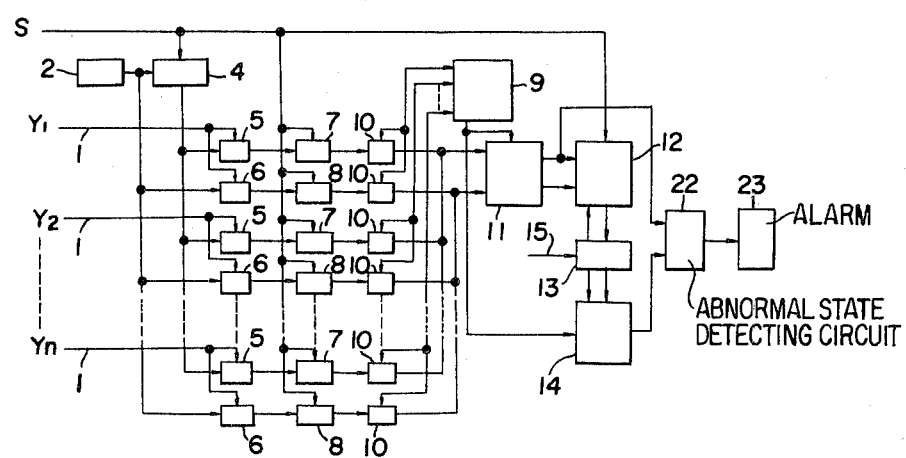

FIG. 6 is a block diagram of another embodiment of the invention. In the embodiment of FIG. 6 the data of the actual operation state of the controlled object are directly read out from the buffer memory write-in address command circuit 11 and the reference operation state data are read out from the reference operation state data memory 14. Both of the data are input to an abnormal state detecting circuit 22 in order to compare both of the data. The abnormal state of the controlled object is communicated by actuating an alarm 23 by an abnormal signal of the abnormal state detecting circuit 22 if both of the data are not consistent.

In the above mentioned embodiment, the cases of monitoring the ON state of the controlled object have been described. However, the OFF state of the controlled object can be monitored by connecting a code inversion circuit for outputting the OFF state during the ON state of the input signal 1 and the ON state during the OFF state of the input signal 1 in the passage of the input signal 1.

In the embodiments, the new data of the actual operation state given under the change of the control data for the controlled object are recorded in the buffer memory and are read out and transferred as the new reference operation state data to the reference operation state data memory. However, it is possible to directly record the actual operation state data in the reference operation state data memory without first recording in the buffer memory.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by letters patent of the United States is:

1. An operation state monitoring apparatus comprising:
   a counter device for counting a duration of at least one of the ON state or the OFF state of input signals which are independent for each of the operation states of a controlled object;
   a memory device for memorizing a duration from the operation initiating reference time when the input signal is switched from the ON state to the OFF state or from the OFF state to the ON state;
   a reference operation state data memory for previously setting the reference operation state of said controlled object;
   means for generating a signal signifying agreement or disagreement of the actual operation state data given by the data of said counter device and said memory device with the reference operation state data given from said reference operation state memory; and
   means for setting desirable data selected from the actual operation state data in said reference operation state data memory as the reference operation state data.

2. An operation state monitoring apparatus comprising:
   a pulse generator for generating pulse trains having a constant period;
   a first counter circuit for counting the pulses of said pulse generator from the operation initiating time of a controlled object;
   a first gate circuit for turning off the gate during the time of either of the ON state or the OFF state of input signals which are independent for each of the operation states of said controlled object to output the pulses of said pulse generator;
   a second counter circuit for counting output pulses of said first gate circuit;
   a second gate circuit for turning off the gate at the time of switching said input signal from the ON state to the OFF state or from the OFF state to the ON state to output the data of said first counter circuit;
   a memory device for memorizing output data of said second gate circuit;
   a reference operation state data memory for previously setting the reference operation state of said controlled object;
   means for generating a signal signifying agreement or disagreement of the actual operation state data given by the data of said second counter circuit and said memory device with the reference operation state data given from said reference operation state data memory; and
   means for setting desirable data selected from the actual operation state data and said reference operation state data memory as the reference operation state data.

3. An operation state monitoring apparatus comprising:
- a first memory device for memorizing a duration from the operation initiating reference time when an input signal for each of the operation states of a controlled object is switched from a ON state to the OFF state or from the OFF state to the ON state;
- a second memory device for memorizing the final time after switching the input signal from the ON state to the OFF state or from the OFF state to the ON state as the duration from the operation initiating reference time;
- a reference operation state data memory for previously setting the reference operation of said controlled object;
- means for generating a signal signifying agreement or disagreement of actual operation state data given by the data of said first and second memory devices with the reference operation state data given from said reference operation state data memory; and
- means for setting desirable data selected from the actual operation state data in said reference operation state data memory as the reference operation state data.

4. An operation state monitoring apparatus comprising:
- a pulse generator for generating pulse trains having a constant period;
- a counter circuit for counting the pulses of said pulse generator from the operation initiating time of said controlled object;
- a first gate circuit for turning off the gate at the time an input signal is switched for each of the operation states of said controlled object from the ON state to the OFF state or from the OFF state to the ON state to output the data of said counter circuit;
- a first memory device for memorizing the output data of said first gate circuit;
- a second gate circuit for turning off the gate at the final time after switching the input signal from a ON state to the OFF state or from the OFF state to the ON state;
- a second memory device for memorizing the output data of said second gate circuit;
- a reference operation state data memory for previously setting the reference operation state of said controlled object;
- means for generating a signal signifying agreement or disagreement of actual operation state data given by the data of said first and second memory devices with the reference operation state data given from said reference operation state data memory; and
- means for setting desirable data selected from the actual operation state data in said reference operation state data memory as the reference operation state data.

5. An operation state monitoring apparatus for monitoring an operation state of a controlled object comprising:
- means for recording actual operation state data in address coded format in a buffer memory,
- means for generating a signal signifying agreement or disagreement of the actual operation state data of said controlled object with the reference operation state data of said controlled object read out from a reference operation state memory,
- means for reading out desirable data from said buffer memory,
- means for setting desirable data selected from the actual operation state data in said reference operation state data memory as the reference operation state data.

* * * * *